United States Patent
Xu et al.

(10) Patent No.: US 11,592,487 B2
(45) Date of Patent: Feb. 28, 2023

(54) METHOD AND APPARATUS FOR OBTAINING RESIDUAL ELECTRIC QUANTITY, ELECTRONIC DEVICE, AND STORAGE MEDIUM

(71) Applicant: BEIJING XIAOMI MOBILE SOFTWARE CO., LTD., Beijing (CN)

(72) Inventors: Zhenhuan Xu, Beijing (CN); Zongqiang Wang, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 0 days.

(21) Appl. No.: 17/232,726

(22) Filed: Apr. 16, 2021

(65) Prior Publication Data
US 2022/0043064 A1   Feb. 10, 2022

(30) Foreign Application Priority Data
Aug. 10, 2020 (CN) .......................... 202010794999.7

(51) Int. Cl.
   *G01R 31/364* (2019.01)
   *G01R 31/387* (2019.01)
   *G01R 31/36* (2020.01)

(52) U.S. Cl.
   CPC ....... *G01R 31/364* (2019.01); *G01R 31/3644* (2013.01); *G01R 31/387* (2019.01)

(58) Field of Classification Search
   None
   See application file for complete search history.

(56) References Cited

U.S. PATENT DOCUMENTS

| | | |
|---|---|---|
| 2012/0029851 A1* | 2/2012 | Nakayama .......... G01R 31/3842 702/63 |
| 2012/0153960 A1* | 6/2012 | Wortham ........... G01R 31/3828 324/426 |
| 2013/0076366 A1* | 3/2013 | Arizono ................ H02J 7/0049 324/435 |
| 2017/0176541 A1 | 6/2017 | Shimizu |
| 2018/0031642 A1* | 2/2018 | Sung .................... G01R 31/367 |
| 2018/0252775 A1* | 9/2018 | Wu ..................... G01R 31/3828 |
| 2019/0227127 A1* | 7/2019 | Liang ................... G01R 31/367 |

OTHER PUBLICATIONS

European Patent Application No. 21170545.4 extended Search and Opinion dated Oct. 22, 2021, 7 pages.

\* cited by examiner

*Primary Examiner* — Nasima Monsur
(74) *Attorney, Agent, or Firm* — Lathrop GPM LLP

(57) ABSTRACT

A method for obtaining a residual electric quantity of a battery in an electronic device includes: obtaining a present electric quantity variation of a battery within a present detection period; obtaining a maximum discharge electric quantity of the battery corresponding to a number of charging and discharging within the present detection period; and obtaining a present residual electric quantity of the battery based on the maximum discharge electric quantity and the present electric quantity variation.

14 Claims, 5 Drawing Sheets

METHOD AND APPARATUS FOR OBTAINING RESIDUAL ELECTRIC QUANTITY, ELECTRONIC DEVICE, AND STORAGE MEDIUM

CROSS-REFERENCE TO RELATED APPLICATION

This application claims priority to Chinese Patent Application No. 202010794999.7, filed on Aug. 10, 2020, the entire contents of which are incorporated herein by reference for all purposes.

TECHNICAL FIELD

The disclosure relates to a field of fast charge design technologies, and particularly relates to a method and an apparatus for obtaining a residual electric quantity of a battery, an electronic device, and a storage medium.

BACKGROUND

As the size of an electronic device increases, electric quantity consumption of the electronic device also increases. Therefore, a residual electric quantity of a battery for most electronic devices at a present moment is generally displayed for convenience of a user. At present, the methods for calculating the residual electric quantity of the battery in the related art may include a Coulombmeter method and an impedance track method.

In the Coulombmeter method, a charging and discharging current is detected by a sensing resistor, and an electric quantity flowing into the battery is determined as a battery capacity. Then the residual electric quantity of the battery is obtained by subtracting a discharge electric quantity battery from the battery capacity.

In the impedance track method, an impedance of the battery is represented by Ra=(Uocv−U)/I when the battery discharges, where Uocv may be found from an OCV curve, and U represents a voltage of the battery in a normal circuit under load. Then, an attenuation rate of a Qmax (maximum discharge capacity) is determined by an average change rate of Ra in an SOC (State of Charge) with a same current between a current discharging and a previous discharging.

However, the above methods for calculating the residual electric quantity of the battery do not take into account that the Qmax in the battery may decrease continuously due to the increase of dead lithium and consumption of electrolyte, thereby causing an inaccurate calculation of the residual electric quantity and reducing user experiences.

SUMMARY

According to a first aspect of embodiments of the disclosure, there is provided a method for obtaining a residual electric quantity of a battery in an electronic device. The method includes: obtaining a present electric quantity variation of a battery within a present detection period; obtaining a maximum discharge electric quantity of the battery corresponding to a number of charging and discharging within the present detection period; and obtaining a present residual electric quantity of the battery based on the maximum discharge electric quantity and the present electric quantity variation.

According to a second aspect of embodiments of the disclosure, there is provided an electronic device. The electronic device includes: a battery, a processor, and a memory. The memory is configured to store a computer program executable by the processor. The processor is configured to obtain a present electric quantity variation of the battery within a present detection period; obtain a maximum discharge electric quantity of the battery corresponding to a number of charging and discharging within the present detection period; and obtain a present residual electric quantity of the battery based on the maximum discharge electric quantity and the present electric quantity variation.

According to a third aspect of embodiments of the disclosure, there is provided a non-transitory computer readable storage medium. When the computer instructions are executed by a processor, a method for obtaining a residual electric quantity of a battery in an electronic device is implemented. The method includes obtaining a present electric quantity variation of a battery within a present detection period; obtaining a maximum discharge electric quantity of the battery corresponding to a number of charging and discharging within the present detection period; and obtaining a present residual electric quantity of the battery based on the maximum discharge electric quantity and the present electric quantity variation.

It is to be understood that both the foregoing general description and the following detailed description are merely exemplary and explanatory, and are not restrictive of the disclosure.

BRIEF DESCRIPTION OF THE DRAWINGS

The accompanying drawings, which are incorporated in and constitute a part of this specification, illustrate embodiments consistent with the disclosure, and serve to explain the principle of the disclosure together with the specification.

DETAILED DESCRIPTION

Exemplary embodiments will be described in detail herein, examples of which are illustrated in the accompanying drawings. When the following description refers to the accompanying drawings, the same or similar elements may be denoted by the same numerals in different accompanying drawings, unless otherwise indicated. The implementations described in the following exemplary embodiments do not represent all implementations consistent with the disclosure. Instead, they are merely examples of apparatuses and methods consistent with some aspects of the disclosure as described in the appended claims.

Figure 1:
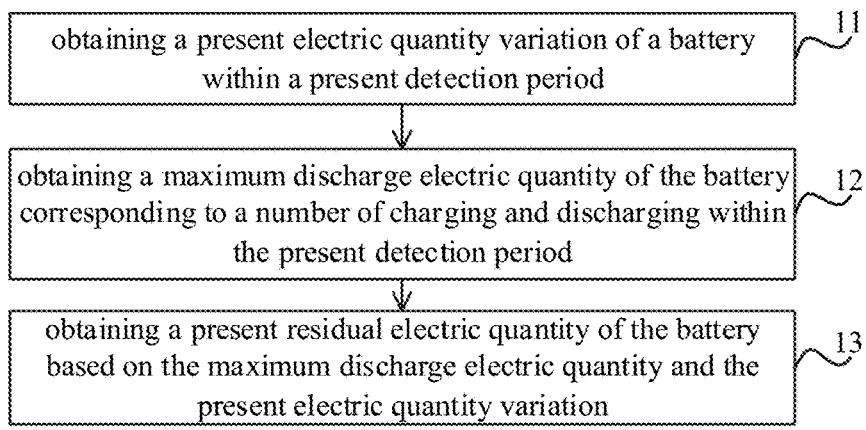
FIG. 1 is a flow chart illustrating a method for obtaining a residual electric quantity of a battery according to an exemplary embodiment.

Embodiments of the disclosure provide a method for obtaining a residual electric quantity of a battery. The method may be applied to an electronic device, such as a smart phone, a tablet, and a smart headphone. FIG. 1 is a flow chart illustrating a method for obtaining a residual electric quantity of a battery according to an exemplary embodiment. The method includes the action at blocks 11~13.

At block 11, a present electric quantity variation of a battery within a present detection period is obtained.

In the embodiments, the electronic device may detect the electric quantity of the battery in the preset detection period, such that a variation of an electric quantity of the battery within each detection period may be obtained.

For example, when a coulombmeter is included in the electronic device, the coulombmeter may collect a charge and discharge current of the battery in a set period, and then obtain a variation of an electric quantity of the battery in each set period by integrating the charge and discharge current in each set period. The electronic device may communicate with the coulombeter to obtain the variation of the electric quantity.

Figure 2:
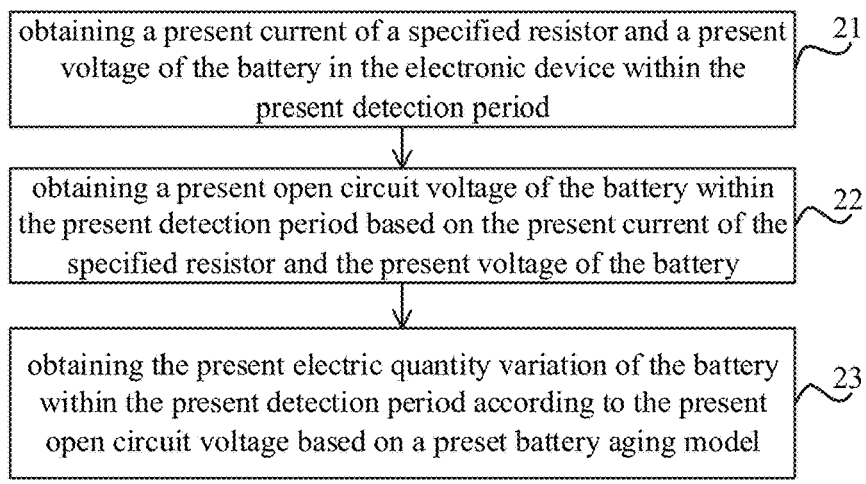
FIG. 2 is a flow chart illustrating obtaining a present electric quantity variation according to an exemplary embodiment.
Figure 3:
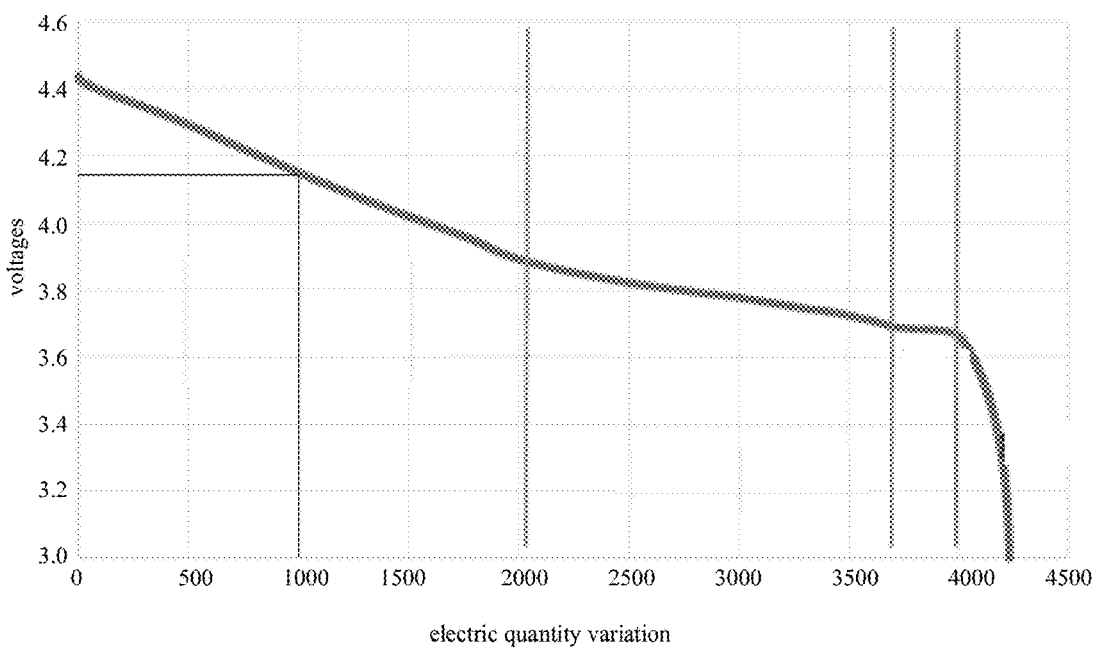
FIG. 3 is a schematic diagram illustrating a curve of a battery aging model according to an exemplary embodiment.

For another example, referring to FIG. 2, at block 21, a specified resistor (e.g., a precision resistor) may collect the charge and discharge current of the battery when the specified resistor is set inside the electronic device. The electronic device may obtain a present current of the specified resistor within the present detection period. In addition, the electronic device may also obtain a present voltage of the battery (such as a voltage of a cell in the battery). At block 22, the electronic device may obtains a present open circuit voltage of the battery within the present detection period based on the present current of the specified resistor and the present voltage of the battery. At block 23, the electronic device may obtain the present electric quantity variation of the battery within the present detection period according to the present open circuit voltage based on a preset battery aging model. FIG. 3 is a schematic diagram illustrating a curve of a battery aging model according to an exemplary embodiment. Referring to FIG. 3, when the present open circuit voltage is 4.15V, the present electric quantity variation is 1000 mAH. The battery aging model may include a battery aging model in the related art or a battery aging model in the present embodiments.

Figure 4:
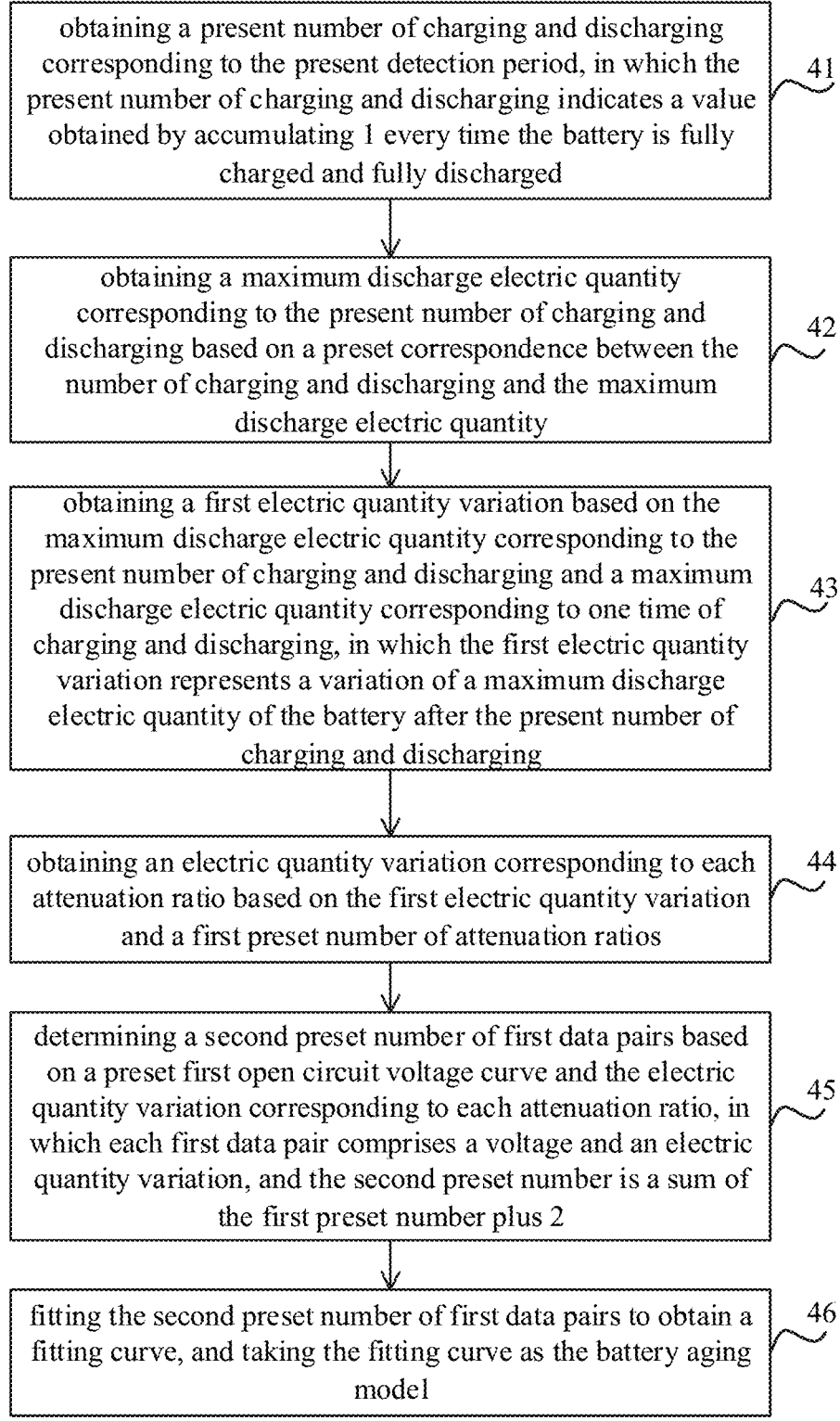
FIG. 4 is a flow chart illustrating obtaining a battery aging model according to an exemplary embodiment.

Referring to FIG. 4, the battery aging model according to the present embodiments may be obtained by the following actions at blocks 41-46.

At block 41, the electronic device may obtain a present number of charging and discharging corresponding to the present detection period. The present number of charging and discharging indicates a value obtained by accumulating 1 every time the battery is fully charged and fully discharged. In other words, an operation for charging the battery to a maximum charge electric quantity and discharging the full electric quantities is considered as a time of charging and discharging. The present number of charging and discharging is obtained by adding 1 to the previous number of charging and discharging. The initial number of charging and discharging of a fresh battery is 0.

Figure 5:
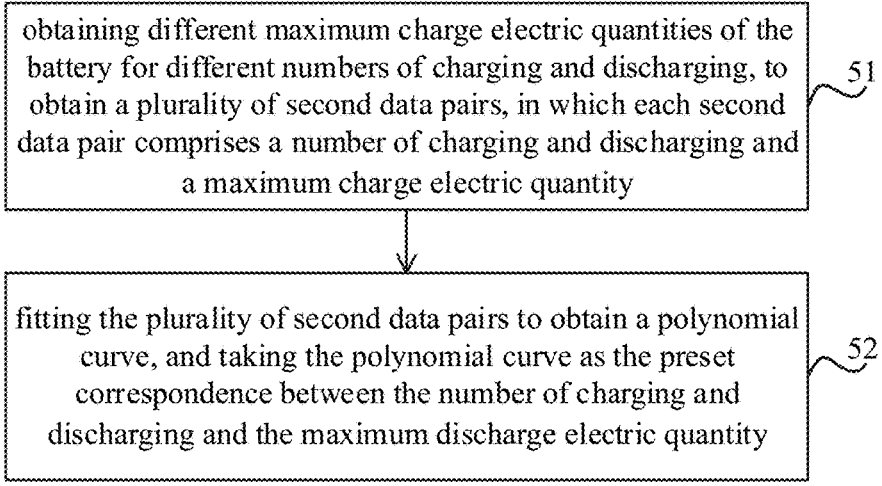
FIG. 5 is a flow chart illustrating obtaining a correspondence between the number of charging and discharging and the maximum discharge electric quantity according to an exemplary embodiment.
Figure 6:
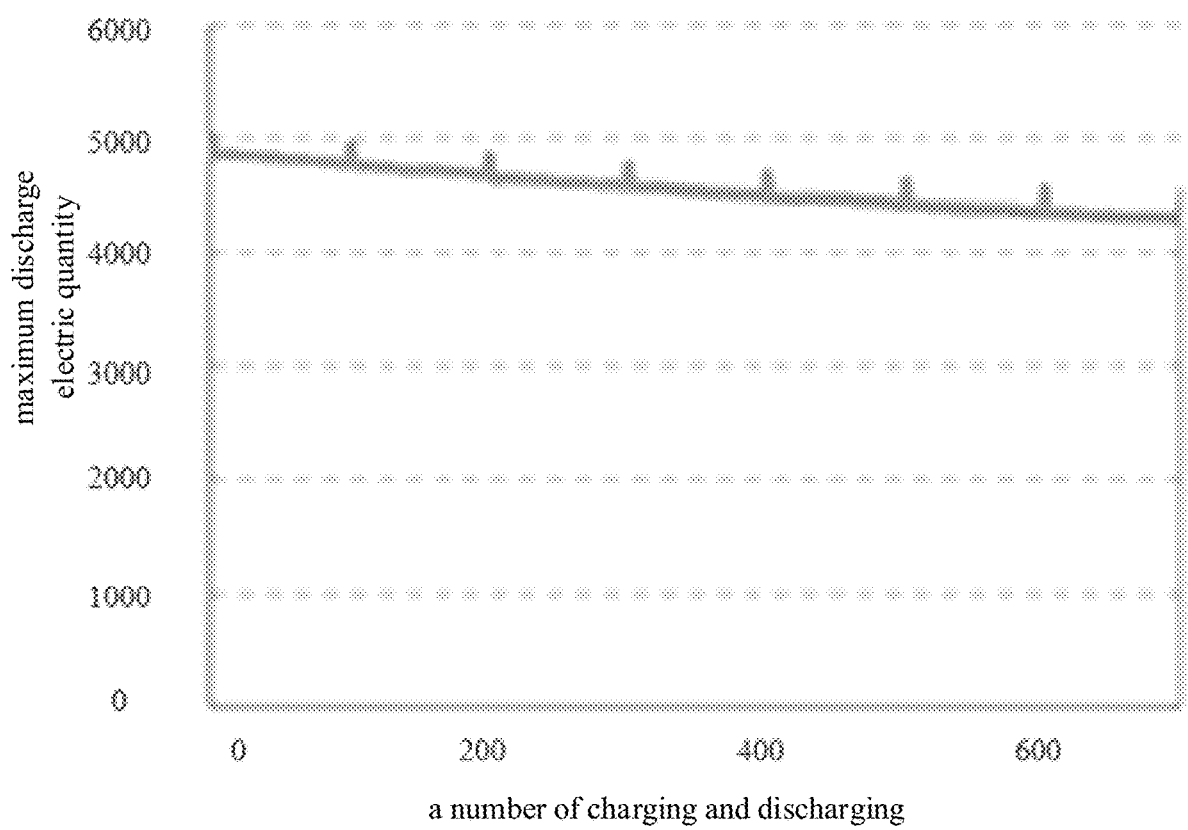
FIG. 6 is a schematic diagram illustrating a curve of a correspondence between the number of charging and discharging and the maximum discharge electric quantity according to an exemplary embodiment.

At block 42, the electronic device may store a preset correspondence between the number of charging and discharging and the maximum discharge electric quantity. The correspondence may be obtained by the following actions at blocks 51-52. Referring to FIG. 5, at block 51, the electronic device may obtain different maximum charge electric quantities of the battery for different numbers of charging and discharging, to obtain a plurality of second data pairs. Each second data pair includes a number of charging and discharging and a maximum charge electric quantity. At block 52, the electronic device may fit the plurality of second data pairs to obtain a polynomial curve, such as a polynomial $Qmax(t)=Qmax(1)(A4*t^2+B4*t+C4)$, with an effect illustrated in FIG. 6. In the polynomial, t represents the number of charging and discharging, $Qmax(1)$ represents a maximum charge electric quantity when the number of charging and discharging is 1, and A4, B4, and C4 respectively represent polynomial coefficients. In this way, the electronic device may take the polynomial curve as the correspondence between the number of charging and discharging and the maximum discharge electric quantity.

It should be noted that, the correspondence between the number of charging and discharging and the maximum discharge electric quantity may be stored in a formula form. The electronic device may calculate a corresponding maximum discharge electric quantity based on the number of charging and discharging and the correspondence. Alternatively, the correspondence between the number of charging and discharging and the maximum discharge electric quantity may also be stored in a table form, then the maximum discharge electric quantity is obtained by looking for a table based on the number of charging and discharging. Then, the electronic device may obtain the maximum discharge electric quantity corresponding to the present number of charging and discharging based on the preset correspondence between the number of charging and discharging and the maximum discharge electric quantity.

At block 43, the electronic device may obtain a first electric quantity variation based on the maximum discharge electric quantity ($Qmax(t)$) corresponding to the present number of charging and discharging and a maximum discharge electric quantity ($Qmax(1)$) corresponding to one time of charging and discharging. The first electric quantity variation is a difference between $Qmax(1)$ and $Qmax(t)$. In other words, the first electric quantity variation represents a variation of a maximum discharge electric quantity of the battery after the present number of charging and discharging;

At block 44, the electronic device may store a first preset number of attenuation ratios. The number of attenuation ratios may be the same as the number of specified points on the first open circuit voltage curve. Therefore, the electronic device may obtain an electric quantity variation corresponding to each attenuation ratio based on the first electric quantity variation and the first preset number of attenuation ratios.

It is assumed that the first preset number is 4, and the first electric quantity variation is $\Delta Q4(t)$. An electric quantity variation corresponding to each attenuation ratio is represented by:

$$\Delta Q4(t) = Q\max(1) - Q\max(t);$$

$$\Delta Q3(t) = \Delta Q4(t) = Q\max(1)*a\%;$$

$$\Delta Q2(t) = \Delta Q4(t)*b\% = Q\max(1)(1-(A4*t2+B4*t+C4))*b\%;$$

$$\Delta Q1(t)=\Delta Q4(t)*c\%=Q\max(1)(1-(A4*t2+B4*t+C4))*c\%,$$

where, a, b and c represent an inherent attenuation rule of the electric quantity of the battery in a same system, which may be obtained by actual measurements and be known values. For example, a, b and c may be taken as 20, 15 and 10 respectively. $\Delta Q3(t)=\Delta Q4(t)$ is defined herein considering that the electric quantity variation changes a little in the DE curve as illustrated in FIG. 7, which indicates that the electric quantity is slowly discharging at this stage and there is a large proportion of invalid capacity lower than a phone shutdown voltage (such as 3.4V).

At block 45, the electronic device may determine a second preset number of first data pairs based on a preset first open circuit voltage curve and the electric quantity variation corresponding to each attenuation ratio. The second preset number is a sum of the first preset number plus 2, That is, an origin position of the first open circuit voltage curve and a position for a maximum discharge electric quantity corresponding to the t-th time of charging and discharging are added. Each first data pair includes a voltage and an electric quantity variation. That is, coordinates of the specified points B1, C1, D1, E1 (positions of maximum discharge electric quantities) in the first open circuit voltage curve after translation are illustrated in FIG. 7.

a coordinate of an endpoint B(t) is (B1−$\Delta Q1$, V1);
a coordinate of an endpoint C(t) is (C1−$\Delta Q2$, V2);
a coordinate of an endpoint D(t) is (D1−$\Delta Q3$, V3);
a coordinate of an endpoint E(t) is (Qmax(1)−$\Delta Q4$,V4); and
a coordinate of an origin A keeps unchanged.

Figure 7:
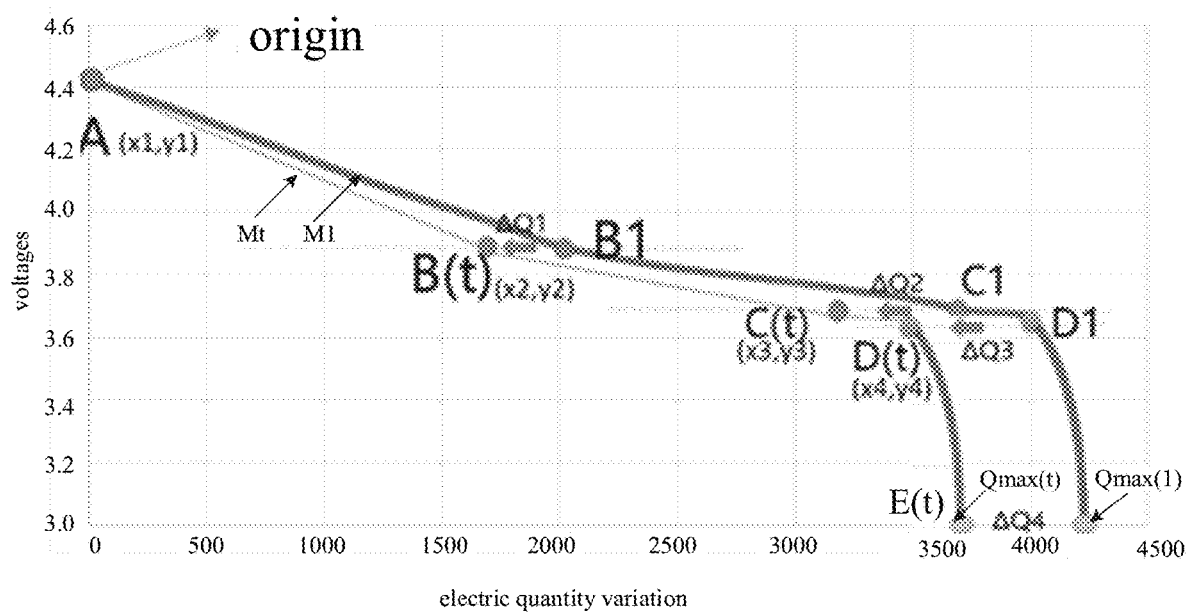
FIG. 7 is a schematic diagram illustrating a curve of a battery aging model according to an exemplary embodiment.

At block 46, the electronic device may fit the second preset number of first data pairs to obtain a fitting curve, and the fitting curve is determined as the battery aging model, and the effect is illustrated by a curve Mt in FIG. 7. The battery aging model in FIG. 7 is obtained by fitting four segments respectively. Therefore, the battery aging model is represented by:

$$Q(t) = \begin{cases} (y-y_2)/(y_1-y_2) = (x-x_2)/(x_1-x_2) \\ (y-y_2)/(y_3-y_2) = (x-x_2)/(x_3-x_2) \\ (y-y_4)/(y_3-y_4) = (x-x_4)/(x_3-x_4) \\ \text{translating the fourth segment} \\ \text{in } A1^*u^5 + B1^*u^4 + C1^*u^3 + D1^*u^2 + E1^*u + F_1 \\ \text{for } \Delta Q4 \text{ along the } x \text{ axis towards the left} \end{cases}$$

$$Q'(t) = \begin{cases} (y-y_2)/(y_1-y_2) = (x-x_2)/(x_1-x_2) \\ (y-y_2)/(y_3-y_2) = (x-x_2)/(x_3-x_2) \\ (y-y_4)/(y_3-y_4) = (x-x_4)/(x_3-x_4) \\ Q(t) - \Delta Q4, \; Q(t) \le y_4 \end{cases},$$

where the curve M1, i.e., the first open circuit voltage curve is represented by Q(t)=A1\*u⁵+B1\*u⁴+C1\*u³+D1\*u²+E1\*u+F₁.

It should be noted that the curve M1 in FIG. 7, i.e., the first open circuit voltage curve, may be obtained by the following ways. For example, the curve M1 is obtained by fitting in segments in case that discharging is performed by employing a current of ≤0.02 C and the voltage is recorded every at least 2 seconds. The first open circuit voltage curve in FIG. 7 may be obtained by fitting in four segments, i.e., an AB1 segment, a B1C1 segment, a C1D1 segment and a D1E1 segment. The skilled in the art may select an appropriate way to obtain the open circuit voltage curve based on the specific scenes, and a corresponding solution falls within the protection scope of the disclosure.

For another example, when the coulombmeter is included in the electronic device, the electronic device may obtain an electric quantity variation outputted by the coulombmeter, which is called as a first variation below. Then the electronic device may obtain an electric quantity variation corresponding to a present voltage of the battery, which is called as a second variation below. The second variation here is obtained based on the battery aging model. The electronic device may compare the first variation with the second variation. When a difference between the first variation and the second variation is lower than or equal to a preset threshold (which may be adjusted), it means that an accuracy of the two methods for obtaining the electric quantity variation is basically the same. In this case, one of the first variation and the second variation is taken as the present electric quantity variation of the battery. When the difference between the first variation and the second variation is greater than the preset threshold, it means that the accuracy of the two methods for obtaining the electric quantity variation is quite different. In this case, the second variation of the battery aging model according to the disclosure is taken as the present electric quantity variation of the battery, or an average value of the first variation and the second variation is taken as the present electric quantity variation of the battery, thereby improving the accuracy of the obtained present electric quantity variation, further improving the accuracy of the residual electric quantity.

At block 12, a maximum discharge electric quantity of the battery corresponding to a number of charging and discharging within the present detection period is obtained.

In the embodiments, the electronic device may store the preset correspondence between the number of charging and discharging and the maximum discharge electric quantity, and may obtain the maximum discharge electric quantity Qmax(t) of the battery based on t times of charging and discharging within the present detection period.

It should be noted that, the correspondence between the number of charging and discharging and the maximum discharge electric quantity may be referred to the contents of the embodiment illustrated in FIG. 4, which is not elaborated here.

At block 13, a present residual electric quantity of the battery is obtained based on the maximum discharge electric quantity and the present electric quantity variation.

In embodiments, the electronic device may obtain the present residual electric quantity of the battery based on the maximum discharge electric quantity for the present number of charging and discharging and the present electric quantity variation of the battery. The present residual electric quantity is represented by:

$$SOC=(Q\max-Qt)/Q\max.$$

In some embodiments, the electronic device may store a correction coefficient. The correction coefficient may be determined by a capacity when the battery is turned off at respective number of charging and discharging. For example, capacities corresponding to 3.4V/3.2V may have errors of 10 mAH/20 mAH respectively, so the correction coefficient k may be set to 0.99. In this way, the present residual electric quantity is represented by:

$$SOC=(Q\max*k-Qt)/Q\max.$$

In an example, k may be set as an error capacity, and the present residual electric quantity is represented by:

$SOC=(Q\max+k-Qt)/Q\max.$

In conclusion, with embodiments of the disclosure, the present electric quantity variation of the battery within the present detection period may be obtained. Then, the maximum discharge electric quantity of the battery corresponding to the number of charging and discharging within the present detection period is obtained. After, the present residual electric quantity of the battery is obtained based on the maximum discharge electric quantity and the present electric quantity variation. In this way, in the embodiments, by adjusting the maximum discharge electric quantity of the battery at each time of charging and discharging, the present residual electric quantity may be obtained more accurately, thereby facilitating to improve user experiences when the electronic device is operated.

Figure 8:
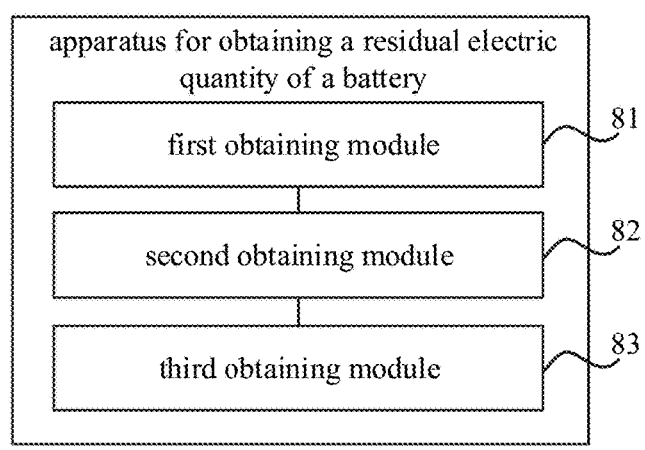
FIG. 8 is a block diagram illustrating an apparatus for obtaining a residual electric quantity of a battery according to an exemplary embodiment.

On the basis of the method for obtaining the residual electric quantity of the battery, embodiments of the disclosure also provide an apparatus for obtaining a residual electric quantity of a battery. Referring to FIG. 8, the apparatus also includes: a first obtaining module 81, a second obtaining module 82, and a third obtaining module 83.

The first obtaining module 81 is configured to obtain a present electric quantity variation of a battery within a present detection period. The second obtaining module 82 is configured to obtain a maximum discharge electric quantity of the battery corresponding to a number of charging and discharging within the present detection period. The third obtaining module 83 is configured to obtain a present residual electric quantity of the battery based on the maximum discharge electric quantity and the present electric quantity variation.

In some embodiments, when a coulombmeter is not included in an electronic device, the first obtaining module includes: a first obtaining unit, a second obtaining unit, and a third obtaining unit. The first obtaining unit is configured to obtain a present current of a specified resistor and a present voltage of the battery in the electronic device within the present detection period. The second obtaining unit is configured to obtain a present open circuit voltage of the battery within the present detection period based on the present current of the specified resistor and the present voltage of the battery. The third obtaining unit is configured to obtain the present electric quantity variation of the battery within the present detection period according to the present open circuit voltage based on a preset battery aging model.

In some embodiments, the apparatus also includes: a fourth obtaining module. The fourth obtaining module includes: a fourth obtaining unit, a fifth obtaining unit, a sixth obtaining unit, a seventh obtaining unit, an eighth obtaining unit, and a ninth obtaining unit. The fourth obtaining unit is configured to obtain a present number of charging and discharging corresponding to the present detection period, in which, the present number of charging and discharging indicates a value obtained by accumulating 1 every time the battery is fully charged and fully discharged. The fifth obtaining unit is configured to obtain a maximum discharge electric quantity corresponding to the present number of charging and discharging based on a preset correspondence between the number of charging and discharging and the maximum discharge electric quantity. The sixth obtaining unit is configured to obtain a first electric quantity variation based on the maximum discharge electric quantity corresponding to the present number of charging and discharging and a maximum discharge electric quantity corresponding to one time of charging and discharging, in which, the first electric quantity variation represents a variation of a minimum discharge electric quantity of the battery after the present number of charging and discharging. The seventh obtaining unit is configured to obtain an electric quantity variation corresponding to each attenuation ratio based on the first electric quantity variation and a first preset number of attenuation ratios. The eighth obtaining unit is configured to determine a second preset number of first data pairs based on a preset first open circuit voltage curve and the electric quantity variation corresponding to each attenuation ratio, in which, each first data pair includes a voltage and an electric quantity variation, and the second preset number is a sum of the first preset number plus 2. The ninth obtaining unit is configured to fit the second preset number of first data pairs to obtain a fitting curve, and taking the fitting curve as the battery aging model.

In some embodiments, the second obtaining module includes: a tenth obtaining unit, and an eleventh obtaining unit. The tenth obtaining unit is configured to obtain the number of charging and discharging corresponding to the present detection period, in which, the number of charging and discharging indicates a value obtained by increasing 1 every time the battery is fully charged and fully discharged. The eleventh obtaining unit is configured to obtain the maximum discharge electric quantity corresponding to the number of charging and discharging based on a preset correspondence between the number of charging and discharging and the maximum discharge electric quantity.

In some embodiments, the apparatus also includes a fifth obtaining module. The fifth obtaining module includes: a twelfth obtaining unit, and a thirteenth obtaining unit. The twelfth obtaining unit is configured to obtain different maximum charging electric quantities of the battery for different numbers of charging and discharging, to obtain multiple second data pairs, in which, each second data pair includes a number of charging and discharging and a maximum charge electric quantity. The thirteenth obtaining unit is configured to fit the multiple second data pairs to obtain a polynomial curve, and to take the polynomial curve as the preset correspondence between the number of charging and discharging and the maximum discharge electric quantity.

In some embodiments, when a coulombmeter is included in an electronic device, the first obtaining module includes: a fourteenth obtaining unit, a fifteenth obtaining unit, and a sixteenth obtaining unit. The fourteenth obtaining unit is configured to obtain a first variation outputted by the coulombmeter. The fifteenth obtaining unit is configured to obtain a second variation corresponding to a present voltage of the battery. The sixteenth obtaining unit is configured to take one of the first variation and the second variation as the present electric quantity variation of the battery when a difference between the first variation and the second variation is lower than or equal to a preset threshold; and to take an average value of the first variation and the second variation as the present electric quantity variation of the battery when the difference between the first variation and the second variation is greater than the preset threshold.

In some embodiments, when a coulombmeter is not included in an electronic device, the third obtaining module includes: a seventeenth obtaining unit, and an eighteenth obtaining unit. The seventeenth obtaining unit is configured to obtain a correction coefficient for the number of charging and discharging corresponding to the present detection period. The eighteenth obtaining unit is configured to obtain the present residual electric quantity of the battery based on the maximum discharge electric quantity, the correction coefficient and the present electric quantity variation.

It may be understood that, the apparatus according to embodiments of the disclosure corresponds to the above method. Detailed contents of the apparatus may be referred to the contents of each embodiment of the method, which are not be elaborated herein.

Figure 9:
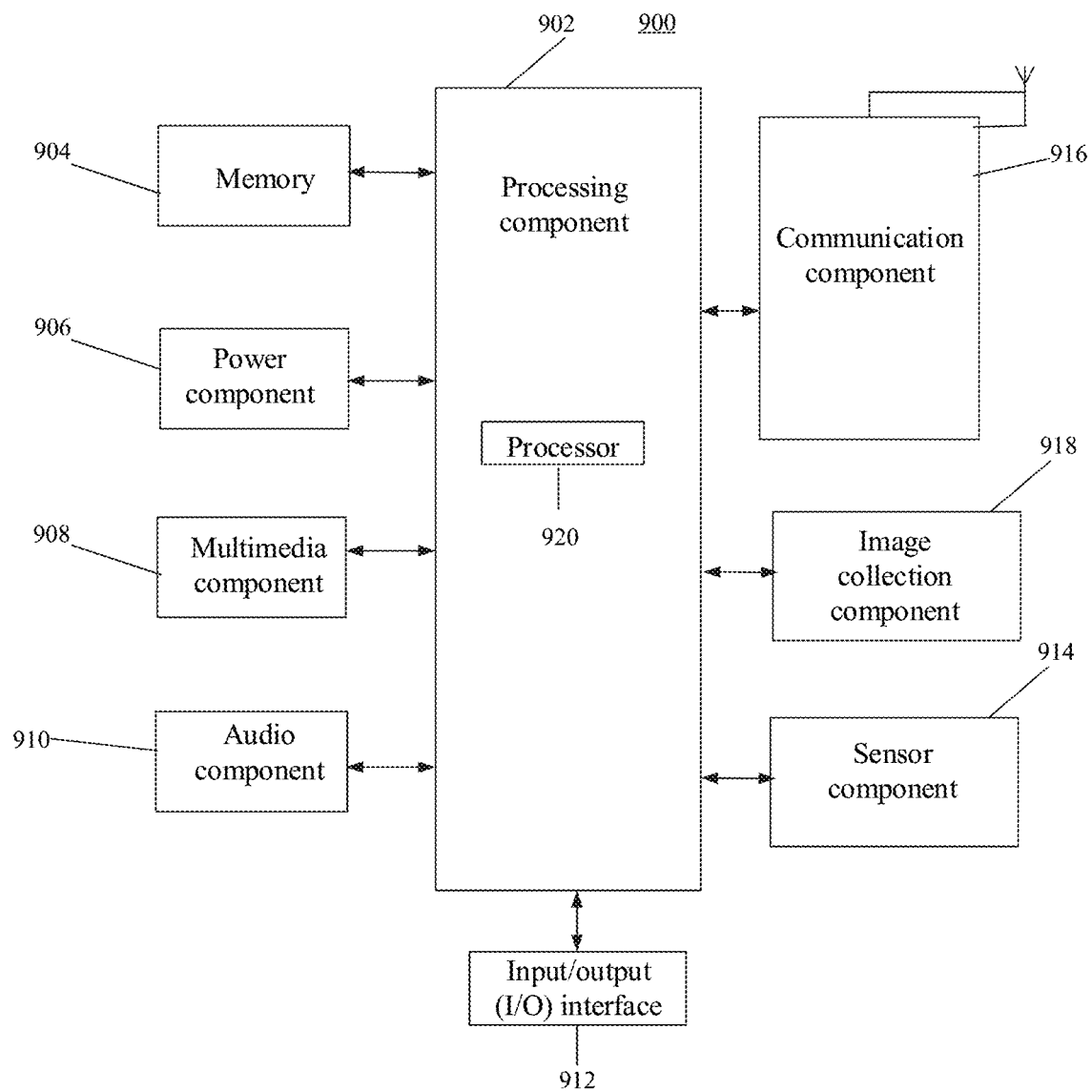
FIG. 9 is a block diagram illustrating an electronic device according to an exemplary embodiment.

FIG. 9 is a block diagram illustrating an electronic device according to an exemplary embodiment. For example, the electronic device 900 may be a mobile phone, a computer, a digital broadcasting terminal, a tablet device, a medical device, a fitness equipment, a personal digital assistant or the like.

As illustrated in FIG. 9, the electronic device 900 may include one or more of: a processing component 902, a memory 904, a power component 906, a multimedia component 908, an audio component 910, an input/output (I/O) interface 912, a sensor component 914, a communication component 916, and an image collection component 918.

The processing component 902 typically controls overall operations of the electronic device 900, such as the operations associated with display, telephone calls, data communications, camera operations, and recording operations. The processing component 902 may include one or more processors 902 for executing a computer program. Moreover, the processing component 902 may include one or more modules which facilitate the interaction between the processing component 902 and other components. For example, the processing component 902 may include a multimedia module to facilitate the interaction between the multimedia component 908 and the processing component 902.

The memory 904 is configured to store various types of data to support the operation of the electronic device 900. Examples of such data include a computer program for any application or method operated on the electronic device 900 for performing contraction data, phonebook data, messages, pictures, video, etc. The memory 904 may be implemented using any type of volatile or non-volatile memory devices, or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic or an optical disk.

The power component 906 is configured to provide power to various components of the electronic device 900. The power component 906 may include a power management system, one or more power sources, and any other components associated with the generation, management, and distribution of power in the electronic device 900. The power component 906 may include a power chip. The controller may communicate with the power chip, to control the power chip to turn on or turn off a switching device, such that the battery may supply power to the motherboard circuit or not.

The multimedia component 908 includes a screen providing an output interface between the electronic device 900 and the user. In some embodiments, the screen may include a liquid crystal display (LCD) and a touch panel (TP). If the screen includes the touch panel, the screen may be implemented as a touch screen to receive an input signal from the user. The touch panel includes one or more touch sensors to sense touches, swipes, and gestures on the touch panel. The touch sensors may not only sense a boundary of a touch or swipe action, but also sense a duration and a pressure associated with the touch or swipe action.

The audio component 910 is configured to output and/or input an audio signal. For example, the audio component 910 includes a microphone ("MIC") for receiving an external audio signal when the electronic device 900 is in an operation mode, such as a call mode, a recording mode, and a voice recognition mode. The received audio signal may be further stored in the memory 904 or transmitted via the communication component 916. In some embodiments, the audio component 910 further includes a speaker to output the audio signal.

The I/O interface 912 is configured to provide an interface between the processing component 902 and peripheral interface modules, such as a keyboard, a click wheel, buttons, and the like.

The sensor component 914 includes one or more sensors for providing status assessments of various aspects of the electronic device 900. For example, the sensor component 914 may detect an open/closed status of the electronic device 900, relative positioning of components, e.g., the display and the keypad of the electronic device 900, a change in position of the electronic device 900 or a component of the electronic device 900, a presence or absence of user contraction with the electronic device 900, an orientation or an acceleration/deceleration of the electronic device 900, and a change in temperature of the electronic device 900.

The communication component 916 is configured to facilitate communication, wired or wirelessly, between the electronic device 900 and other devices. The electronic device 900 may access a wireless network based on a communication standard, such as Wi-Fi, 2G, 3G, 4G, 5G, or a combination thereof. In some exemplary embodiments, the communication component 916 receives a broadcast signal or broadcast associated information from an external broadcast management system via a broadcast channel. In some exemplary embodiments, the communication component 916 further includes a near field communication (NFC) module to facilitate short-range communications. For example, the NFC module may be implemented based on a radio frequency identification (RFID) technology, an infrared data association (IrDA) technology, an ultra-wideband (UWB) technology, a Bluetooth (BT) technology, and other technologies.

In some exemplary embodiments, the electronic device 900 may be implemented with one or more application specific integrated circuits (ASICs), digital signal processors (DSPs), digital signal processing devices (DSPDs), programmable logic devices (PLDs), field programmable gate arrays (FPGAs), controllers, micro-controllers, microprocessors, or other electronic components, for performing the above methods.

In some exemplary embodiments, there is also provided a non-transitory computer readable storage medium including a computer program, such as the memory 904 including instructions. The computer program may be executed by the processor in the electronic device 900 for performing the above method. For example, the non-transitory computer readable storage medium may be a ROM, a RAM, a CD-ROM, a magnetic tape, a floppy disc, an optical data storage device, and the like.

Other implementations of the disclosure will be apparent to the skilled in the art from consideration of the specification and practice of the disclosure disclosed here. This disclosure is intended to cover any variations, uses, or adaptations of the disclosure following the general principles thereof and including such departures from the disclosure as come within known or customary practice in the art. It is intended that the specification and examples be considered as exemplary only, with a true scope and spirit of the disclosure being indicated by the following claims.

It should be understood that, the disclosure is not limited to the exaction construction that has been described above and illustrated in the accompanying drawings, and that various modifications and changes may be made without departing from the scope thereof. The scope of the disclosure only be limited by the appended claims.

What is claimed is:

1. A method for obtaining a residual electric quantity of a battery in an electronic device, comprising:
   obtaining a present electric quantity variation of the battery within a present detection period;
   obtaining a maximum discharge electric quantity of the battery corresponding to a number of charging and discharging within the present detection period; and
   obtaining a present residual electric quantity of the battery based on the maximum discharge electric quantity and the present electric quantity variation;
   when a coulombmeter is not included in the electronic device, obtaining the present electric quantity variation comprises:
   obtaining a present current of a specified resistor in the electronic device and a present voltage of the battery within the present detection period;
   obtaining a present open circuit voltage of the battery within the present detection period based on the present current of the specified resistor and the present voltage of the battery; and
   obtaining the present electric quantity variation of the battery within the present detection period corresponding to the present open circuit voltage based on a preset battery aging model;
   wherein the preset battery aging model is obtained by:
   obtaining a present number of charging and discharging corresponding to the present detection period, in which the present number of charging and discharging indicates a value obtained by accumulating 1 every time the battery is fully charged and fully discharged;
   obtaining a maximum discharge electric quantity corresponding to the present number of charging and discharging based on a preset correspondence between the number of charging and discharging and the maximum discharge electric quantity;
   obtaining a first electric quantity variation based on the maximum discharge electric quantity corresponding to the present number of charging and discharging and a maximum discharge electric quantity corresponding to one time of charging and discharging, in which the first electric quantity variation represents a variation of a maximum discharge electric quantity of the battery after the present number of charging and discharging;
   obtaining an electric quantity variation corresponding to each attenuation ratio based on the first electric quantity variation and a first preset number of attenuation ratios;
   determining a second preset number of first data pairs based on a preset first open circuit voltage curve and the electric quantity variation corresponding to each attenuation ratio, in which each first data pair comprises a voltage and an electric quantity variation, and the second preset number is a sum of the first preset number plus 2; and
   fitting the second preset number of first data pairs to obtain a fitting curve, and taking the fitting curve as the battery aging model.

2. The method of claim 1, wherein obtaining the maximum discharge electric quantity of the battery corresponding to the number of charging and discharging within the present detection period comprises:
   obtaining the number of charging and discharging corresponding to the present detection period, in which the number of charging and discharging indicates a value obtained by increasing 1 every time the battery is fully charged and fully discharged; and
   obtaining the maximum discharge electric quantity corresponding to the number of charging and discharging based on a preset correspondence between the number of charging and discharging and the maximum discharge electric quantity.

3. The method of claim 2, wherein the preset correspondence between the number of charging and discharging and the maximum discharge electric quantity is obtained by:
   obtaining different maximum charging electric quantities of the battery for different numbers of charging and discharging, to obtain a plurality of second data pairs, in which each second data pair comprises a number of charging and discharging and a maximum charge electric quantity; and
   fitting the plurality of second data pairs to obtain a polynomial curve, and taking the polynomial curve as the preset correspondence between the number of charging and discharging and the maximum discharge electric quantity.

4. The method of claim 1, wherein, when a coulombmeter is included in the electronic device, obtaining the present electric quantity variation comprises:
   obtaining a first variation outputted by the coulombmeter;
   obtaining a second variation corresponding to a present voltage of the battery based on a preset battery aging model;
   taking one of the first variation and the second variation as the present electric quantity variation of the battery when a difference between the first variation and the second variation is lower than or equal to a preset threshold; and
   taking an average value of the first variation and the second variation as the present electric quantity variation of the battery when the difference between the first variation and the second variation is greater than the preset threshold.

5. The method of claim 1, wherein, when a coulombmeter is not included in an electronic device, obtaining the present residual electric quantity of the battery comprises:
   obtaining a correction coefficient for the number of charging and discharging corresponding to the present detection period; and
   obtaining the present residual electric quantity of the battery based on the maximum discharge electric quantity, the correction coefficient and the present electric quantity variation, in which the correction coefficient is be determined by a capacity when the battery is turned off at respective number of times of charging and discharging.

6. An electronic device comprising:
   a battery;
   a processor; and
   a memory, configured to store a computer program executable by the processor,
   wherein the processor is configured to
   obtain a present electric quantity variation of the battery within a present detection period;

obtain a maximum discharge electric quantity of the battery corresponding to a number of charging and discharging within the present detection period; and obtain a present residual electric quantity of the battery based on the maximum discharge electric quantity and the present electric quantity variation;

when a coulombmeter is not included in the electronic device, the processor is further configured to:

obtain a present current of a specified resistor and a present voltage of the battery within the present detection period obtain a present open circuit voltage of the battery within the present detection period based on the present current of the specified resistor and the present voltage of the battery; and obtain the present electric quantity variation of the battery within the present detection period according to the present open circuit voltage based on a preset battery aging model;

wherein the preset battery aging model is obtained by:

obtaining a present number of charging and discharging corresponding to the present detection period, in which the present number of charging and discharging indicates a value obtained by accumulating 1 every time the battery is fully charged and fully discharged;

obtaining a maximum discharge electric quantity corresponding to the present number of charging and discharging based on a preset correspondence between the number of charging and discharging and the maximum discharge electric quantity;

obtaining a first electric quantity variation based on the maximum discharge electric quantity corresponding to the present number of charging and discharging and a maximum discharge electric quantity corresponding to one time of charging and discharging, in which the first electric quantity variation represents a variation of a maximum discharge electric quantity of the battery after the present number of charging and discharging;

obtaining an electric quantity variation corresponding to each attenuation ratio based on the first electric quantity variation and a first preset number of attenuation ratios;

determining a second preset number of first data pairs based on a preset first open circuit voltage curve and the electric quantity variation corresponding to each attenuation ratio, in which each first data pair comprises a voltage and an electric quantity variation, and the second preset number is a sum of the first preset number plus 2; and fitting the second preset number of first data pairs to obtain a fitting curve, and taking the fitting curve as the battery aging model.

7. The electronic device of claim 6, wherein the processor is further configured to:

obtain the number of charging and discharging corresponding to the present detection period, in which, the number of charging and discharging indicates a value obtained by increasing 1 every time the battery is fully charged and fully discharged; and obtain the maximum discharge electric quantity corresponding to the number of charging and discharging based on a preset correspondence between the number of charging and discharging and the maximum discharge electric quantity.

8. The electronic device of claim 7, wherein the preset correspondence between the number of charging and discharging and the maximum discharge electric quantity is obtained by:

obtaining different maximum charging electric quantities of the battery for different numbers of charging and discharging, to obtain a plurality of second data pairs, in which each second data pair comprises a number of charging and discharging and a maximum charge electric quantity; and fitting the plurality of second data pairs to obtain a polynomial curve, and taking the polynomial curve as the preset correspondence between the number of charging and discharging and the maximum discharge electric quantity.

9. The electronic device of claim 6, wherein, when a coulombmeter is included in the electronic device, the processor is further configured to:

obtain a first variation outputted by the coulombmeter;

obtain a second variation corresponding to a present voltage of the battery based on a preset battery aging model; and take one of the first variation and the second variation as the present electric quantity variation of the battery when a difference between the first variation and the second variation is lower than or equal to a preset threshold; and take an average value of the first variation and the second variation as the present electric quantity variation of the battery when the difference between the first variation and the second variation is greater than the preset threshold.

10. The electronic device of claim 6, wherein, when a coulombmeter is not included in the electronic device, the processor is further configured to:

obtain a correction coefficient for the number of charging and discharging corresponding to the present detection period; and obtain the present residual electric quantity of the battery based on the maximum discharge electric quantity, the correction coefficient and the present electric quantity variation, in which the correction coefficient is be determined by a capacity when the battery is turned off at respective number of times of charging and discharging.

11. A non-transitory computer readable storage medium having computer instructions stored thereon, wherein when the computer instructions are executed by a processor, a method for obtaining a residual electric quantity of a battery in an electronic device is implemented, the method comprising:

obtaining a present electric quantity variation of a battery within a present detection period;

obtaining a maximum discharge electric quantity of the battery corresponding to a number of charging and discharging within the present detection period; and obtaining a present residual electric quantity of the battery based on the maximum discharge electric quantity and the present electric quantity variation;

when a coulombmeter is not included in the electronic device, obtaining the present electric quantity variation comprises:

obtaining a present current of a specified resistor in the electronic device and a present voltage of the battery within the present detection period;

obtaining a present open circuit voltage of the battery within the present detection period based on the present current of the specified resistor and the present voltage of the battery; and obtaining the present electric quantity variation of the battery within the present detection period corresponding to the present open circuit voltage based on a preset battery aging model;

wherein the preset battery aging model is obtained by:

obtaining a present number of charging and discharging corresponding to the present detection period, in which the present number of charging and discharging indicates a value obtained by accumulating 1 every time the battery is fully charged and fully discharged;

obtaining a maximum discharge electric quantity corresponding to the present number of charging and discharging based on a preset correspondence between the number of charging and discharging and the maximum discharge electric quantity;

obtaining a first electric quantity variation based on the maximum discharge electric quantity corresponding to the present number of charging and discharging and a maximum discharge electric quantity corresponding to one time of charging and discharging, in which the first electric quantity variation represents a variation of a maximum discharge electric quantity of the battery after the present number of charging and discharging;

obtaining an electric quantity variation corresponding to each attenuation ratio based on the first electric quantity variation and a first preset number of attenuation ratios;

determining a second preset number of first data pairs based on a preset first open circuit voltage curve and the electric quantity variation corresponding to each attenuation ratio, in which each first data pair comprises a voltage and an electric quantity variation, and the second preset number is a sum of the first preset number plus 2; and fitting the second preset number of first data pairs to obtain a fitting curve, and taking the fitting curve as the battery aging model.

12. The storage medium of claim 11, wherein obtaining the maximum discharge electric quantity of the battery comprises:

obtaining the number of charging and discharging corresponding to the present detection period, in which the number of charging and discharging indicates a value obtained by increasing 1 every time the battery is fully charged and fully discharged; and obtaining the maximum discharge electric quantity corresponding to the number of charging and discharging based on a preset correspondence between the number of charging and discharging and the maximum discharge electric quantity.

13. The storage medium of claim 12, wherein the preset correspondence between the number of charging and discharging and the maximum discharge electric quantity is obtained by:

obtaining different maximum charging electric quantities of the battery for different numbers of charging and discharging, to obtain a plurality of second data pairs, in which each second data pair comprises a number of charging and discharging and a maximum charge electric quantity; and fitting the plurality of second data pairs to obtain a polynomial curve, and taking the polynomial curve as the preset correspondence between the number of charging and discharging and the maximum discharge electric quantity.

14. The storage medium of claim 11, wherein, when a coulombmeter is included in the electronic device, obtaining the present electric quantity variation of the battery within the present detection period comprises:

obtaining a first variation outputted by the coulombmeter;

obtaining a second variation corresponding to a present voltage of the battery based on a preset battery aging model;

taking one of the first variation and the second variation as the present electric quantity variation of the battery when a difference between the first variation and the second variation is lower than or equal to a preset threshold; and taking an average value of the first variation and the second variation as the present electric quantity variation of the battery when the difference between the first variation and the second variation is greater than the preset threshold.

* * * * *